US012505975B2

(12) United States Patent
Henstra et al.

(10) Patent No.: US 12,505,975 B2
(45) Date of Patent: Dec. 23, 2025

(54) FOCUSED ION BEAM SYSTEM AND METHOD

(71) Applicant: FEI Company, Hillsboro, OR (US)

(72) Inventors: Alexander Henstra, Eindhoven (NL); Galen Gledhill, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 304 days.

(21) Appl. No.: 18/339,933

(22) Filed: Jun. 22, 2023

(65) Prior Publication Data

US 2023/0420213 A1 Dec. 28, 2023

Related U.S. Application Data

(60) Provisional application No. 63/355,030, filed on Jun. 23, 2022.

(51) Int. Cl.

| | |
|---|---|
| ***H01J 37/153*** | (2006.01) |
| ***H01J 37/147*** | (2006.01) |
| ***H01J 37/21*** | (2006.01) |
| ***H01J 37/305*** | (2006.01) |

(52) U.S. Cl.

CPC ........ *H01J 37/153* (2013.01); *H01J 37/1474* (2013.01); *H01J 37/21* (2013.01); *H01J 37/305* (2013.01); *H01J 2237/1534* (2013.01)

(58) Field of Classification Search

CPC ...... H01J 37/153; H01J 37/1474; H01J 37/21; H01J 37/305; H01J 37/1534

See application file for complete search history.

(56) References Cited

U.S. PATENT DOCUMENTS

| | | | | |
|---|---|---|---|---|
| 6,949,756 | B2 * | 9/2005 | Gerlach | H01J 37/3178 250/307 |
| 6,977,386 | B2 | 12/2005 | Gerlach et al. | |
| 9,679,742 | B2 | 6/2017 | Swinford et al. | |
| 2004/0140438 | A1 * | 7/2004 | Gerlach | B82Y 10/00 250/492.23 |
| 2006/0145087 | A1 * | 7/2006 | Parker | H01J 9/42 250/396 R |

(Continued)

FOREIGN PATENT DOCUMENTS

| | | | |
|---|---|---|---|
| JP | 2003036808 A | * | 2/2003 |
| JP | 2004356211 A | * | 12/2004 |

OTHER PUBLICATIONS

EP23180871.8, Extended European Search Report, Nov. 21, 2023, 8 pages.

*Primary Examiner* — David E Smith

(57) ABSTRACT

An ion beam system for modifying a sample or workpiece surface, comprises: an ion source for generating ions; an ion beam focusing column configured to direct ions from the ion source to form an ion beam and focus the ion beam towards a target area; and a sample stage for receiving and positioning the sample or workpiece at the target area, wherein the ion beam focusing column comprises: an aperture plate having a non-circular beam limiting aperture configured to limit the extent of a transmitted ion beam; and a multipole aberration compensator configured to apply a four-fold astigmatism to the ion beam to compensate spherical aberration produced by one or more lenses in the ion beam focusing column. The multipole aberration compensator may be a multipole element that generates an octupole field. A corresponding method is provided.

16 Claims, 9 Drawing Sheets

(56) References Cited

U.S. PATENT DOCUMENTS

| | | | | |
|---|---|---|---|---|
| 2010/0116984 | A1* | 5/2010 | Ogawa | H01J 37/3056<br>250/311 |
| 2011/0114851 | A1 | 5/2011 | Purser et al. | |

* cited by examiner

FOCUSED ION BEAM SYSTEM AND METHOD

CROSS REFERENCE TO RELATED APPLICATION

This application claims the benefit of U.S. Provisional Application 63/355,030, filed Jun. 23, 2022, which is incorporated herein by reference.

TECHNICAL FIELD

The present invention relates to focused ion beam (FIB) systems and methods of operating focused ion beam systems. In particular, the systems and methods provide increased cutting and milling performance.

BACKGROUND

Methods and systems for creating microscopic features involve scanning a finely focused ion beam over a target surface of a sample to mill, etch or deposit material. Milling involves direct removal of material by the impact of ions. This process is known as sputtering. In deposition of material, a gas such as an organometallic compound is directed towards the impact point of the ion beam on the sample surface. The gas decomposes in the presence of the ion beam to add material to the sample surface.

FIB systems are similar to scanning electron microscopes or transmission electron microscopes except that instead of directing a beam of electrons at a sample, a beam of ions is directed at the sample. Focused ion beam milling is used in a number of microfabrication industries including the semiconductor industry and the manufacture of microelectromechanical systems (MEMS). The technique may be used either in the processing and manufacture in these or other industries, or in analysing the structures of resultant structures.

An example of the latter is sample preparation for transmission electron microscope, TEM, analysis. Sample preparation uses focused ion beam systems to remove a surface or layer, or to etch a channel, that is then imaged by the electron beam. The sample preparation may be necessary because the TEM requires a thin sample. The focused ion beam may be used to mill and expose a region of interest in the sample. A grain boundary or defect in a semiconductor material may be milled to expose the region of interest for TEM analysis. Furthermore, in SEM or TEM analysis it is sometimes necessary to expose a cross-section of material for analysis.

In the manufacture of MEMS the FIB may be used to remove material to define features of the MEMS. Such systems have features with dimensions of the order of microns or less and possibly down to nanometre sizes.

In general, higher beam current densities for the focused ion beams result in material being removed more quickly, whereas a lower current can be focused more precisely.

U.S. Pat. No. 6,949,756 B2, by the current applicant, relates to a focused ion beam system providing a shaped ion beam having low current density and sharp edges. The shaped ion beam is provided by a two-lens imaging ion-focusing column and a shaping aperture between the two lenses. The second of the two lenses forms an image of the shaping aperture on the sample at the target plane. The current density of the shaped ion beam is lowered so that an etch or deposition rate is not limited by exhaustion of adsorbed gas molecules. The overall beam current can be increased to increase the etch and deposition rate. The size or diameter of the beam is larger than an unshaped beam and has a substantially uniform current density profile with sharp edge resolution. Such a beam can be stepped across a target surface to produce uniform etching or deposition over a large area.

U.S. Pat. No. 9,679,742 B2, also by the current applicant, describes a method for optimising a shaped working beam having a sharp edge for making precise cuts and a high current beam for faster processing. The ion beam is directed through a working aperture and ion beam parameters are optimised to provide an ion beam profile that produces a sharp edge resolution.

U.S. Pat. No. 6,977,386 B2, further by the current applicant, describes improved angular aperture schemes for generating shaped beam spots having a desired geometric shape from rectangular, elliptical, and semi-elliptical apertures having a sharp edge. A sharper beam edge may be made by offsetting the rectangular or elliptical aperture to the ion beam axis in combination with under-focus. The sharp edge can be used for precision milling applications and the under-focusing allows the beam to be made large enough to have sufficient current or current density for efficient milling.

These prior art techniques use a variety of apertures and defocus to provide an ion beam with a sharp edge. However, it is desirable to increase milling performance and throughput by increasing ion beam current. Spherical aberration prevents increasing the beam current when apertures are used.

SUMMARY OF THE INVENTION

The present invention provides an ion beam system for modifying a sample or workpiece surface, the system comprising: an ion source for generating ions; an ion beam focusing column configured to direct ions received from the ion source to form an ion beam and focus the ion beam towards a target area; and a sample stage for receiving the sample or workpiece to be modified and for positioning the sample or workpiece surface at the target area, wherein the ion beam focusing column comprises: an aperture plate having a non-circular beam limiting aperture configured to limit the lateral extent of the ion beam passing therethrough; and a multipole aberration compensator configured to apply a four-fold astigmatism to the ion beam to compensate for spherical aberration, such as produced by one or more lenses of the ion beam focusing column. The non-circular beam limiting aperture, which may be an elongate aperture or slot-shaped aperture, confines the beam to a small spot size. By making the aperture elongate it has a major dimension and a minor dimension. The leading edge of the beam is preferably that of the minor dimension. The major dimension allows use of an increased beam current. When the beam is focused down to a small spot by the focusing column, conventionally, third order spherical aberration may result in interdependence between the major and minor spot size dimensions such that the larger major dimension size prevents an optimal spot size in the minor dimension from being achieved. The multipole aberration compensator may provide four-fold astigmatism to the ion beam to compensate for this third order aberration and prevent or limit aberration of the focused spot in the minor dimension as imaged at a sample or workpiece surface. The multipole aberration compensator applies the four-fold astigmatism to shape the beam to compensate for third order spherical aberrations. Preferably, an elongate aperture shape is used such that increased current can be supplied while maintaining the beam minor dimension so as to maintain precision of processing. Increased current results in an increased rate of removal of material from the sample thereby increasing throughput.

Astigmatism is an optical effect commonly associated with the human eye. In the human eye different curvatures to the lens of the eye or the shape of the eye result in light not being focused to a single spot, but for example to two spots based on different curvature in the vertical and horizontal directions. In an ion beam system a similar effect occurs and can be considered to add a stretching and squashing effect to an image along a line. Two-fold astigmatism has the same effect but in two orthogonal directions and three-fold astigmatism has this effect in three equally distributed angles around the azimuthal direction. Four-fold astigmatism, which is being used here, has this effect at four equally distributed angles around the azimuthal direction, but symmetry makes this seem as though it is eight equally distributed angles around the azimuthal direction.

The multipole aberration compensator may be a multipole element configured to generate an octupole field. The multipole element is preferably an octupole element or is a multipole element having more than eight poles such as 12-poles or 16-poles. Alternatively, the multipole aberration corrector may comprise a plurality of multi-pole elements or sub-elements stacked to provide a corresponding effect such as an octupole field. For example, two octupole sub-elements may be stacked to form a 16-pole element to produce the octupole field. The number of poles in the multipole element is preferably even. The non-circular beam limiting aperture may be a slot-shaped aperture, such as a substantially rectangular aperture. The substantially rectangular aperture may have rounded corners but the radius of the corners is much less than the length of the sides. The rounded corners may be a result of limitations in manufacturing small size apertures. Alternatively, the non-circular beam limiting aperture may take other shapes as set out below.

The multipole aberration compensator is preferably located at a position along the ion beam path before a final focussing lens, for example, such that the four-fold astigmatism is applied before the ion beam reaches final focussing. Other positions are possible, such as anywhere between the first lens and final focussing lens, or before beam broadening starts to occur due to spherical aberration from the final focussing lens.

The ion beam focusing column images the ion source. The shaped aperture allows large image angles along one direction while limiting image angles along the other direction. The shaped aperture limits spherical aberration in one direction, but the large image angle in the other direction requires the aberration compensator. The aberration compensator may be considered to compensate aberration along diagonal directions.

The non-circular beam limiting aperture may have a first dimension parallel to a scan direction of the ion beam and a second dimension orthogonal to the scan direction of the ion beam, and wherein the four-fold astigmatism is aligned with the first dimension direction of the aperture.

The multipole aberration compensator may comprise eight or more poles and a pair of the poles of the same polarity may be arranged in opposition along the first dimension direction. For an ion beam formed of metal ions or other positively charged ions the poles are arranged in opposition along the first dimension and may be configured to provide a positive voltage field. In general, the voltage on this pair of poles should be the same as the charge on the ions of the ion beam. In other words, the long axis of the aperture is preferably aligned to the direction from one plate to the other of a pair of opposing positive plates of the multipole element. For the multipole element, the poles will be of alternating polarity. For an octupole element each pole will be arranged respectively at 45° to each other around the azimuthal axis. The poles aligned along the long axis of the aperture may preferably extend up to around 22.5° to the long axis of the aperture.

The non-circular beam limiting aperture may be an elliptical aperture, an oval aperture, or a substantially rectangular aperture. Preferably, the aperture is elongate or slot-shaped.

The non-circular beam limiting aperture may be a substantially rectangular aperture and the multipole aberration compensator may comprise a pair of poles of the same polarity arranged in opposition along a direction parallel to the direction of the long sides of the rectangle. The long centreline of the rectangular aperture may be centred along the direction between the pair of poles.

The non-circular beam limiting aperture may be an elliptical aperture and the multipole aberration compensator may comprise a pair of poles of the same polarity arranged in opposition along a direction parallel to the direction of the major axis of the elliptical aperture. The long centreline of the elliptical aperture may be centred along the direction between the pair of poles. Corresponding considerations may be applied for an oval aperture.

The ion beam system may further comprise a beam deflector system configured to deflect the ion beam and move the ion beam across the target area. The deflector system may be configured to move the ion beam in a first scan direction across the target area, and the non-circular aperture may be arranged with its major dimension aligned such that the ion beam major dimension at the target area is parallel to the first scan direction. The non-circular aperture may be arranged such that the ion beam has a minor dimension in the target area, and the deflector system may be configured to move the ion beam across the target area with a leading edge corresponding to, that is having a width of, the minor dimension.

The deflector system may be configured to raster scan the ion beam across the target area, and the major dimension of the ion beam at the target area may be parallel to the scan line direction of the raster scan.

The ion beam system may further comprise a multipole aberration compensator controller configured to apply voltages to the multipole aberration compensator to induce four-fold astigmatism to the ion beam. Four-fold astigmatism arises when an octupole field is used.

The ion beam focusing column may comprise a first lens and a second lens, the first lens arranged to collect ions generated by the ion source to form an ion beam, and the second lens arranged to focus the ion beam towards the target plane. The aperture plate may be located to provide the elongate beam limiting aperture in the path of the ion beam between the first lens and second lens. The multipole aberration compensator may be positioned between the aperture plate and the second lens.

The second lens may be configured to focus the ion beam towards the target area. It is this focusing with higher beam currents and an elongate beam cross-section that may result in the third-order spherical aberration providing interdependence of spot-size between the cross-dimensions. The multipole aberration compensator is configured to provide the four-fold astigmatism to eliminate or reduce this spherical aberration.

The ion beam system may be configured for ion beam milling, gas-assisted milling or deposition.

The present invention further provides a method of modifying a sample or workpiece using an ion beam, the method comprising: positioning a sample or workpiece with a surface to be modified at a target area; generating ions from an ion source; forming an ion beam from the ions using a lens in an ion beam focusing column; limiting the extent of the ion beam by directing the beam through a non-circular aperture; inducing or applying, using a multi-pole aberration compensator, four-fold astigmatism to the aperture limited ion beam to compensate for spherical aberration to the ion beam resulting from one or more lenses in the ion beam focusing column; and directing the ion beam at the target plane to modify the sample or workpiece surface.

The step of using a multipole aberration compensator to induce a four-fold astigmatism comprises using a multipole element to generate an octupole field. The four-fold astigmatism may be applied to the ion beam prior to the beam reaching a final focussing lens.

The method may further comprise moving the ion beam relative to the sample or workpiece surface to scan the ion beam across the surface, wherein the non-circular aperture has a first dimension direction parallel to the scan direction of the ion beam and a second dimension direction orthogonal to the scan direction of the ion beam. The four-fold astigmatism may be aligned with the first dimension direction of the aperture.

The multipole aberration compensator may comprise a pair of poles of the same polarity arranged in opposition along the first dimension direction. Preferably, for metal ions the polarity of the poles arranged along the first dimension direction is positive.

The non-circular beam limiting aperture may be an elliptical aperture, an oval aperture or a substantially rectangular aperture. Preferably, the aperture is elongate such as forming a slot-shaped aperture.

The non-circular beam limiting aperture may be a substantially rectangular aperture and the multipole aberration compensator may comprise a pair of poles of the same polarity arranged in opposition along a direction parallel to the direction of the long sides of the rectangle. The long centreline of the rectangular aperture may be centred along the direction between the pair of poles.

The non-circular beam limiting aperture may be an elliptical aperture and the multipole aberration compensator may comprise a pair of poles of the same polarity arranged in opposition along a direction parallel to the direction of the major axis of the elliptical aperture. The long centreline of the elliptical aperture may be centred along the direction between the pair of poles. Corresponding considerations may be applied for an oval aperture.

Compensating for the spherical aberration may comprise imparting a four-fold astigmatism to the ion beam using the multipole aberration compensator, wherein the four-fold astigmatism is aligned with the elongate direction of the aperture. Without the compensation the larger major dimension could cause aberration to the minor dimension. This could prevent the spot size in the minor dimension from being as small as desired. The compensation reduces or eliminates the interdependence of spot-size between the orthogonal dimensions.

The method may further comprise deflecting of the ion beam to move it in a first scan direction across the target area. The non-circular aperture may be arranged with its major dimension aligned such that the ion beam major dimension at the target area is parallel to the first scan direction. The method may further comprise moving the ion beam across the target area with a leading edge corresponding to a minor dimension of the ion beam.

The method may further comprise raster scanning the ion beam across the target area, wherein the major dimension of the ion beam at the target area may be parallel to the scan line direction of the raster scan.

A multipole aberration compensator controller applies voltages to the multipole aberration compensator to induce four-fold astigmatism to the ion beam. The step of applying voltages across the, for example, eight poles generates an octupole field.

The method may further comprise performing an alignment step to determine the voltages to apply to the octupole or multipole element to optimize the octupole field to compensate for spherical aberration.

The method may further comprise tuning the multi-pole aberration compensator to maximise the sharpness of the edges of the ion beam in the scanning direction. Tuning may comprise any of adjusting voltages applied to the poles of the multipole aberration compensator, and adjusting the lateral and/or rotational position of the multipole aberration compensator. Alternatively, the ion beam position may be adjusted to have optimum spherical aberration compensation by the multipole aberration compensator.

The present invention may further comprise a method of ion beam milling, gas assisted milling or deposition comprising any of the steps described above.

The present invention further provides for milling, cutting or etching a sample using the system and methods described herein.

BRIEF DESCRIPTION OF THE DRAWINGS

Embodiments of the present invention, and aspects of the prior art, will now be described with reference to the accompanying drawings, of which.

DETAILED DESCRIPTION

Figure 1:
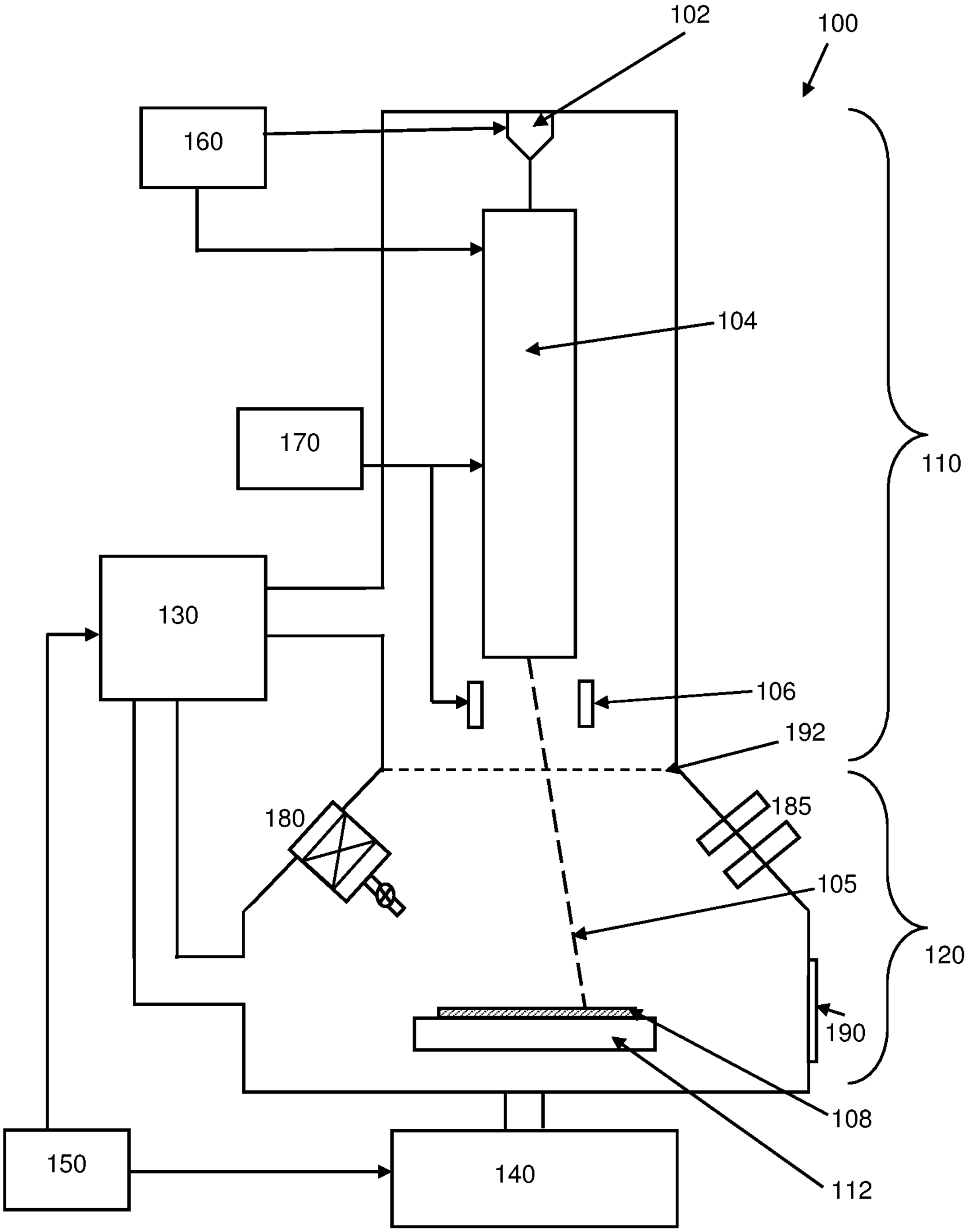
FIG. 1 is a schematic diagram of a focused ion beam system according to the present invention.

FIG. 1 is a schematic diagram of a focused ion beam system 100. The system 100 comprises a chamber that in use is evacuated. The chamber 100 comprises a neck portion 110 in which the ion source 102 is located, and a processing portion 120 in which the sample or workpiece 108 is processed, for example, milled or etched etc. Ion source 102 may be a liquid metal ion source (LM IS) such as a gallium ion source. Also in the neck portion 110 of the chamber is the ion focusing column 104 which focuses ions from the ion source into a beam. The focusing column may comprise various electrostatic lenses and apertures for shaping and focusing the beam to a well-confined beam. Towards the base of the neck portion 110 or on entry to the processing portion 120 of the chamber are provided deflector plates 106 or deflector electrodes. The deflector plates 106 or electrodes steer the direction of propagation of the ion beam 105 as the ions move towards the sample such that the ion beam 105 may be scanned across the sample or workpiece. In the processing portion of the chamber the workpiece or sample 108 is shown on movable stage 112. Movable stage 112 is configured for moving the sample relative to the chamber and also the ion beam. For example, gross alignment of the sample to the ion beam may be achieved using the movable stage 112 such that the region of interest on the sample is largely in line with incidence of the ion beam. The deflector plates 106 perform the precise control of the ion beam 105 across the parts of the wider region of interest to be processed. The movable stage 112 may provide movement of the sample in two directions, such as the x and y directions in a plane. The movable stage 112 may also provide in-plane rotational movement such as may be required to align the sample with scan directions of the ion beam provided by the deflector plates.

Ion pump 130 is provided for evacuating the chamber. Connections to the neck portion 110 and processing portion 120 are provided such that the ion pump operates to evacuate each part of the chamber together. Pumping system 140 is also provided for evacuating the processing portion of the chamber 120. Vacuum controller 150 controls both the ion pump 130 and the pumping system 140.

The focused ion beam system also requires a high voltage power source 160 which is connected to the ion source 102 to generate the ions. The high voltage power source is also connected to the ion focusing column. The ion source 102 may have a tip made of an inert material such as tungsten. The tip extends to a fine point similar to the tip of a needle. The size of the tip is very small such that the electric field at the tip is very high. For example, the tip may be of the order of nanometres in size and the electric field at the tip may be of the order of $1\times10_8$ volts per cm. A source of material that is to provide the ions for the ion beam is provided close to the tip. The ions, such as gallium ions, flow to the end of the tip and are ionized by the high electric field at the tip. Electrodes in the focusing column also provide a high voltage to accelerate the ions. The voltage applied here from the high voltage source 160 may be in the range 1-50 keV, such as 30 keV. A high voltage is also applied in the ion beam focusing column. The potential difference directs the ions towards the sample and movable stage 112.

Beam controller 170 is connected to electrodes in the ion focusing column and also to the deflection plates 106. The beam controller is configured to control the voltage on the deflector plates to change the position at which the ion beam hits the sample so as to scan or move the ion beam across the sample. For example, the ion beam may be raster scanned across the sample, or alternatively the ion beam may be moved across the sample in another desired pattern. Accordingly, beam controller may comprise a pattern generator for applying voltages across the deflection plates to scan the beam in a first direction, such as the x direction and then step in the y direction and again scan in the x direction so as to form the raster scan. In FIG. 1 the deflection plates 106 are shown as being provided to act on the ion beam after passing through the ion beam focusing column. However, in other embodiments the deflector plates 106 may be provided to act on the ion beam before the beam passes through the final lens of the focusing column 104, as will be discussed later. In some embodiments the pattern scanned by the ion beam on the sample may be directly controlled by a user through a user interface coupled to the beam controller 170, or by a predetermined path that has been programmed into the controller.

In the processing portion 120 of the chamber a gas source 180 and an imaging system 185 may be provided. The gas source 180 may be provided at the side of this portion of the chamber and arranged to direct gas towards the sample. The gas source may include a transfer tube to direct the gases to the sample. The transfer tube includes a valve for controlling the supply of gas. The gas source 180 is used for deposition or for enhancing etching or milling. When it is desirable to deposit material on to etched or milled regions of the sample, the gas is released and is adsorbed on to the surface of the sample at the exposed locations. For etching or milling purposes, gaseous material may condense on the sample surface and when irradiated by the ion beam may enhance the etching or milling at the incident location.

The chamber further comprises a door 190 to the processing portion 120 of the chamber. The door allows access to the chamber such that a sample or workpiece can be inserted into the chamber for processing. A gas valve 192 may be provided between the neck portion 110 of the chamber and the processing portion 120 of the chamber. The gas valve 192 can be closed when the door 190 is opened to seal off the ion source 102 and focusing column 104.

The vacuum control 140 and gas source 180 may be operated to provide a desired vapour flux in the chamber directed towards the sample for etching or depositing material.

As discussed above, the high voltage power supply 160 provides voltages in the focusing column to accelerate and focus the ions. When ions strike the sample or workpiece the energy of the ions may initiate a reaction between the gases adhered to the surface and increase material removal. Alternatively, the removal of material by ions may leave an exposed surface to which gas molecules may attach to.

The vacuum system evacuates the chamber down to a pressure of between $1.3\times10^{-5}$ Pa ($1\times10^{-7}$ Torr) and $6.7\times10^{-2}$ Pa ($5\times10^{-4}$ Torr). This pressure is raised a little by emission of gases from gas source 180, thereby providing a pressure of around $1.3\times10^{-3}$ Pa ($1\times10^{-5}$ Torr).

The imaging system 185 is provided in the processing portion 120 of the chamber and may comprise an electron multiplier for detecting secondary emission and a video camera for capturing images of the workpiece as it is worked on. In some embodiments the apparatus may include an electron microscope for imaging the sample between processing operations.

The present invention aims to increase milling performance over the prior art. The prior art methods described in U.S. Pat. No. 6,949,756 B2, U.S. Pat. No. 9,679,742 B2, and U.S. Pat. No. 6,977,386 B2 describe methods on which the beam shape is adjusted to provide a sharp edge to the ion beam for more precise milling and etching applications. However, the production of the sharp edge can result in reduced beam currents and milling rates. It is desirable to increase the milling and etching performance such that greater amounts of material are removed more quickly, for example, while maintaining a sharp edge to the ion beam.

Figure 2A:
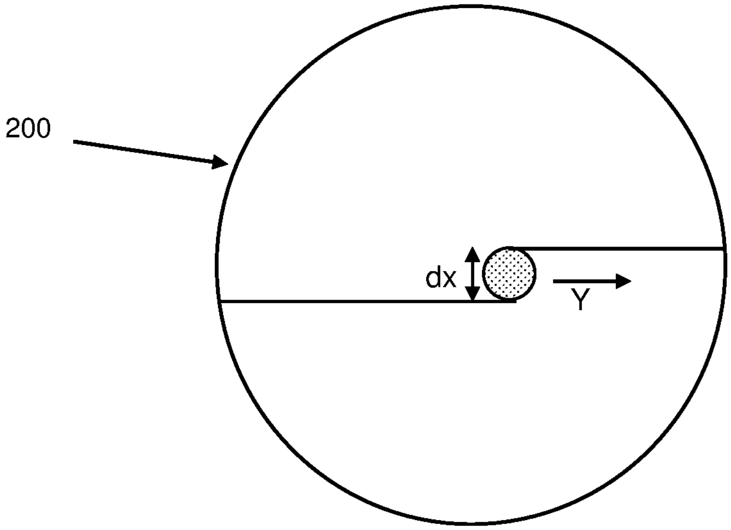
FIGS. 2A and 2B are respectively schematic diagrams of a circular ion beam spot and rectangular ion beam spot milling or etching across a circular region of a sample.

Conventionally, focused ion beam cutting or milling is performed with a focused symmetric spot. In this case the speed at which material is removed from the surface of a sample or workpiece is limited to the width of the spot, which we may describe as dx. FIG. 2A shows a symmetric spot of width dx moving across a workpiece of sample in direction Y. The spot is being raster scanned across the circular region 200 such that in the figure the region above the current scan position has already been processed by the ion beam to remove material. The region below the current scan position has not yet been milled or etched.

The amount of material that is removed and speed of removal for a given spot size is limited by the beam current for the spot. However, increasing the current without increasing the spot size results in increased current density and results in the ion beam producing a less precise cut, due to beam broadening for example.

Figure 2B:
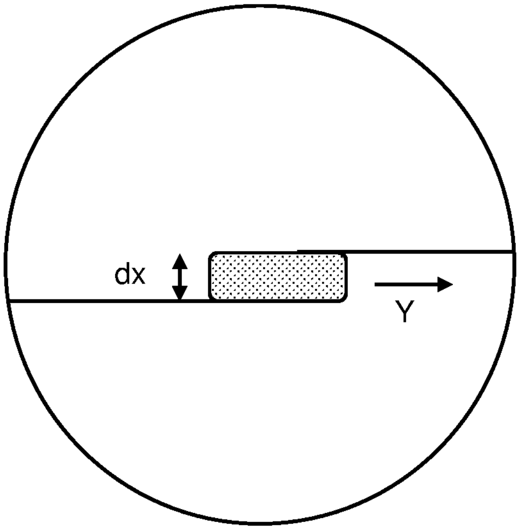

A possibility for increasing the current and therefore material removal rate is to increase the spot size such that more ion beam current can be suppled without increasing current density and losing precision. By making the beam elongate the beam width dx is maintained but more current can be applied due to an increase in the beam in the Y direction, for example. For example, a rectangular beam spot is shown in FIG. 2B which maintains the beam width dx, for example, at its leading edge, but has an increase in dimension in the direction (Y) the beam moves across the sample.

Figure 3:
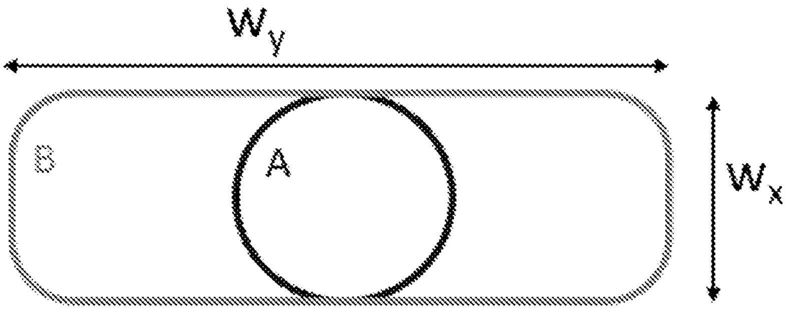
FIG. 3 is schematic diagram comparing an elongate and a circular beam limiting aperture.

To shape the beam in this way an aperture that forms an elongated beam is used. For example, as shown in FIG. 3 a rectangular aperture may be used in which the aperture size is increased to a length Wy whereas the width of the aperture is maintained at Wx.

In focused ion beam systems, as for electron microscopes and optical systems, aberrations can limit the spot size and shape that can actually be achieved. In focused ion beam systems chromatic aberration and spherical aberration are limiting factors. Similar to conventional optics chromatic aberration is a result of ions having different energies being focused by lenses by different amounts. In general, for ion beam systems the ions produced by the ion source and focusing column have a well-defined narrow range of energies. Spherical aberration is a result of optics such as lenses focusing ions differing amounts depending on whether they are close to the lens central axis or farther away. Here when referring to optics we mean ion beam focusing and shaping components as opposed to components for focusing and shaping an optical beam.

For ion beams, a circularly symmetric beam may exhibit spherical aberration when focused to a spot which limits the spot size to a disc of diameter d given by $$d = \frac{1}{2}C_s\alpha^3$$

where Cs is the coefficient of spherical aberration and a is the half-angle/convergence angle of the beam from the lens to the ion axis.

Expanding this to an elongate beam the aberration in the two cross-directions, x, y, of the beam result in a spot size given by:

$$x=C_s\alpha(\alpha_2+\beta^2) \text{ and } y=C_s\beta(\alpha^2+\beta^2)$$

where $\alpha$ and $\beta$ are the half-angle/convergence angle of the beam from the lens to the ion axis for the respective x and y directions.

Figure 4:
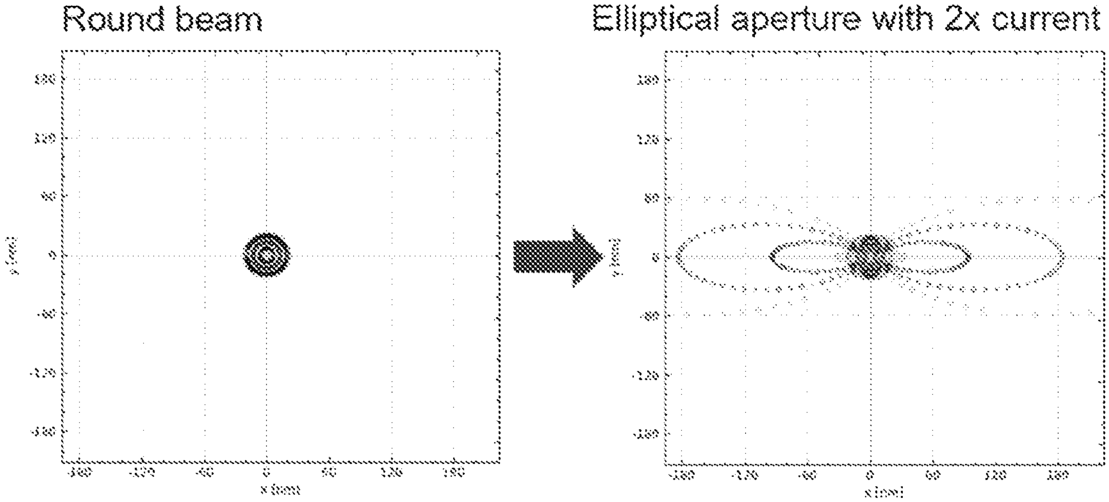
FIG. 4 shows how a circular ion beam spot will experience third order aberration when the beam current is doubled and passed through an elliptical aperture.

The $x=C_s\alpha\beta^2$ term provides a problem because it links the beam current in the two cross-directions of the elongate beam. That is, the x-dimension of the beam is determined not only by $\alpha$ but also by $\beta$ (the angle in the y-direction). This means that increasing the beam current by expanding the beam size in one direction, namely the y-direction, will result in aberration in the other direction, namely the x-direction. In a similar regard, FIG. 4 shows the effect of changing a beam to elliptical and increasing the current by a factor of 2. In FIG. 4 the left-hand figure shows a conventional circular spot focused down to a circular spot of 40 nm diameter. In the right hand figure the beam has been passed through an elliptical aperture and the current increased by a factor of 2. Spherical aberration causes the beam to spread out in both x and y directions which would result in a reduction in precision of the ion beam.

The present invention proposes the use of an octupole field to compensate for third order spherical aberration $C_S$. It does this by providing a counteracting or compensating third order aberration, $A_3$, which results from four-fold astigmatism provided by the octupole field. That is, in the same way a quadrupole field can be used to focus an ion beam into a line, for example, by providing a focusing effect in the +x and −x directions but defocusing in the +y and −y directions, an octupole field provides a focusing or stretching effect every 45 degrees around the beam axis or azimuthal direction. The actual directions of focusing will depend on the relative rotational orientation between the octupole field and aperture, and will be explained in more detail in later paragraphs. In the following we describe how the four-fold astigmatism provides compensation to third order spherical aberration for beams having different dimensions in x and y directions.

Third order aberrations in x and y are given by $x=\partial S/\partial\alpha$ and $y=\partial S/\partial\beta$. Integrating the preceding equation for S with respect to x and y and adding a third order aberration $A_3$ provided by the four-fold astigmatism aberration of the octupole field results in $$S = \frac{1}{4}C_S(\alpha^2+\beta^2)^2 + \frac{1}{4}A_3(\alpha^4 - 6\alpha^2\beta^2 + \beta^4) \quad \text{Equation A}$$

If the magnitude of the astigmatism aberration of the octupole is set to $A_3=C_S/3$ then the equation simplifies to $$S = \frac{1}{3}C_s(\alpha^4+\beta^4).$$

Differentiating with respect to $\alpha$ and $\beta$ allows us to obtain the minimum spot size in x and y which are given by:

$$x = \frac{4}{3}C_s\alpha^3 \text{ and } y = \frac{4}{3}C_s\beta^3, \quad \text{Equations B}$$

Hence, the interdependence between the focused spot size in the two cross-directions can be eliminated using an octupole field generating four-fold astigmatism $A_3$. If we refer to Equation A in the preceding paragraphs we can consider this another way. By setting the relationship $A_3=C_S/3$, the third order aberration from the $C_s\alpha^2\beta^2$ term, and caused by the four-fold astigmatism of the octupole field, may be used to balance out, and thereby compensate, for the third order spherical aberration resulting from the $A_3\alpha^2\beta^2$ term.

Without including the astigmatism provided by the octupole (that is, when $A_3=0$) the x value in equations B would include an additional term of $C_s\alpha\beta^2$. For an elongated aperture $\beta \gg \alpha$ results in this additional term becoming very large for an elongate or slot aperture. For example, with $\beta$ five times greater than $\alpha$ for an elongate aperture, the minimum beam dimension in the x-direction could expand to 25 times that for a spherical beam. The astigmatism compensation substantially eliminates this term. However, it should be noted that when applying an octupole field to yield compensation for the spherical aberration, the size of the beam in the x-direction may be increased slightly by a factor of 4/3 (that is, around a 30% increase) for a given beam size but better overall control can be achieved.

Figure 5:
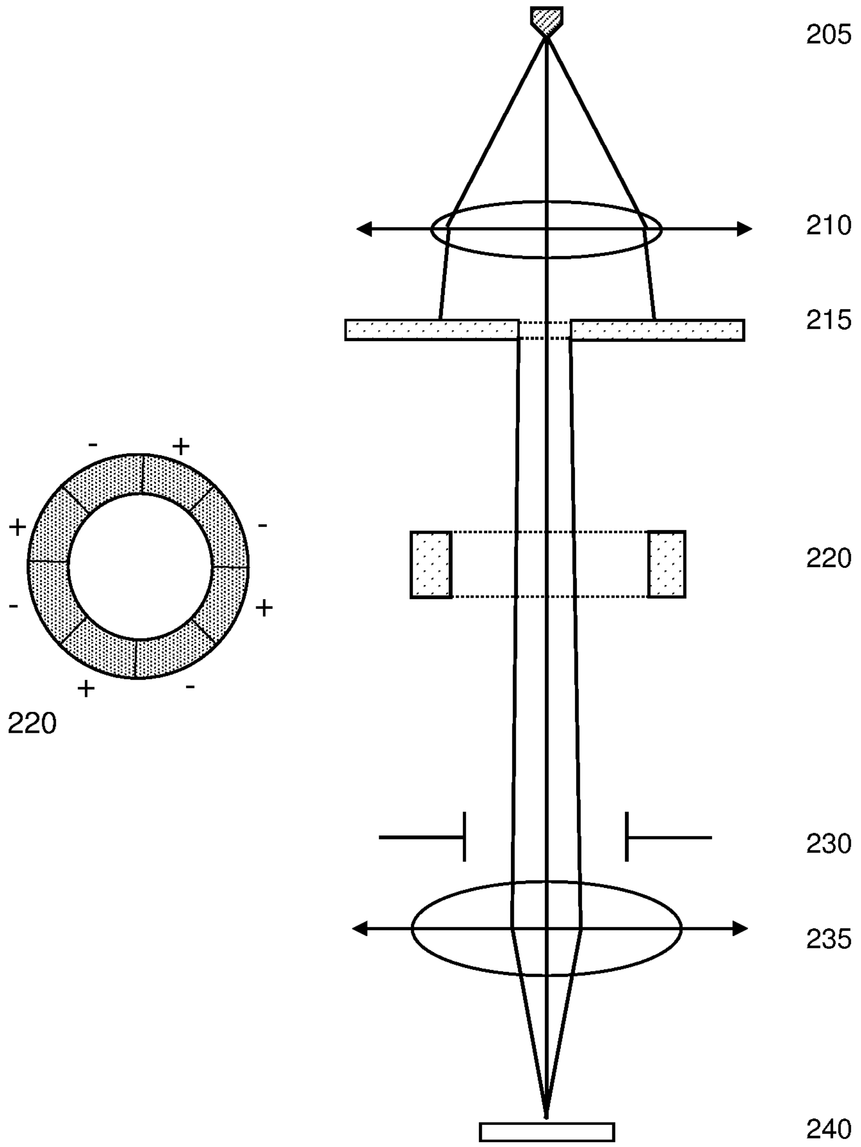
FIG. 5 is a schematic diagram of the optics arrangement for a focusing column of a FIB system according to the present invention.

FIG. 5 shows an embodiment of the optical components for an ion beam focusing column for performing the present invention. The ion beam focusing column comprises first and second lenses 210 and 235, as well as other optical components. The ion beam focusing column may, for example, be the ion beam focusing column 104 shown in FIG. 1.

Ions are generated at ion source 205 which corresponds to ion source 102 in FIG. 1. Ions leaving the ion source 205 are ejected at a range of angles. First lens 210 focuses ions in a range incident on the lens. The first lens brings the ions towards convergence and depending on its focal length could, without other components in the column, bring the ions to a focus at a plane close to the second lens 235. Aperture plate has an aperture 215. The aperture may have a non-circular shape such as an elongate or slot shape. The aperture limits the ions that are to form the ion beam to those within a certain range of angles. This aperture is used to limit the beam size and to therefore set the spot size or shape at the sample surface. An electrostatic octupole element 220 is provided next in the focusing column. Preferably, the octupole element is provided along the azimuthal direction before the final lens 235 or is provided before the ion beam becomes sufficiently focussed by the final lens that spherical aberration occurs. The octupole element 220 comprises eight electrodes of alternating polarity around the ring, as shown in the plan view of the octupole element on the left of FIG. 5. In other words, the voltage applied is static but the polarity of the voltage is opposite for immediately neighbouring electrodes. Hence, numbering the electrodes consecutively from one to eight around the ring would mean that, for example, even numbered electrodes have positive polarity whereas odd numbered electrodes would have negative polarity. The octupole element 220 provides an octupole field to generate the four-fold astigmatism to the beam as discussed above. The four-fold astigmatism provides the spherical aberration compensation discussed above. Other multipole elements or a combination of multipole elements may be used instead that also provide four-fold astigmatism. Such astigmatism would not be possible for lower order multipole elements but would be possible for higher order multipole elements, for example, a 12-pole or 16-pole multipole element. Alternatively, the four-fold astigmatism may be provided by stacking multipole elements in series along the azimuthal direction. For example, two octupole elements may be stacked to form a 16-pole element to produce the octupole field. In some embodiments the ion beam focusing column may comprise an octupole element for other beam conditioning purposes. In such a case additional control may be provided to the octupole element to produce the third order aberration compensation in combination with its other beam conditioning function. This additional control may include the superposition of control voltages required to produce the aberration compensation and the conditioning functionality.

The next component in the ion beam path shown in FIG. 5 is the deflector assembly 230 which is used to deflect the ion beam such that it is incident at the desired position on the sample or workpiece. The deflector assembly 230 may scan the ion beam across the sample such as by raster scanning across the surface. Following the deflector 230 is second lens 235 in the focusing column. The second lens focuses the ion beam to a small spot size on or close to the sample or workpiece surface.

FIG. 5 shows one embodiment of the ion beam focusing column but other embodiments are possible. For example, FIG. 1 shows deflector plates 106 after the ion beam focusing column and hence would be provided after the second or focusing lens 235. This is different to the embodiment of FIG. 5 in which the deflector plates 230 or deflector assembly are provided before the second lens 235. Furthermore, the deflector plates or assembly may include or be accompanied by a stigmator. A stigmator is used in conventional focused ion beam milling systems to correct an elliptical beam to the more desirable circular one. In the present invention the ion beam may be elliptical or rectangular but the stigmator may still be provided to adjust or stretch the dimensions of the beam. The ion beam focusing column may further comprise other features for beam correction and manipulation such as other multipole electrostatic devices, electromagnetic multipole devices and apertures.

Figure 6:
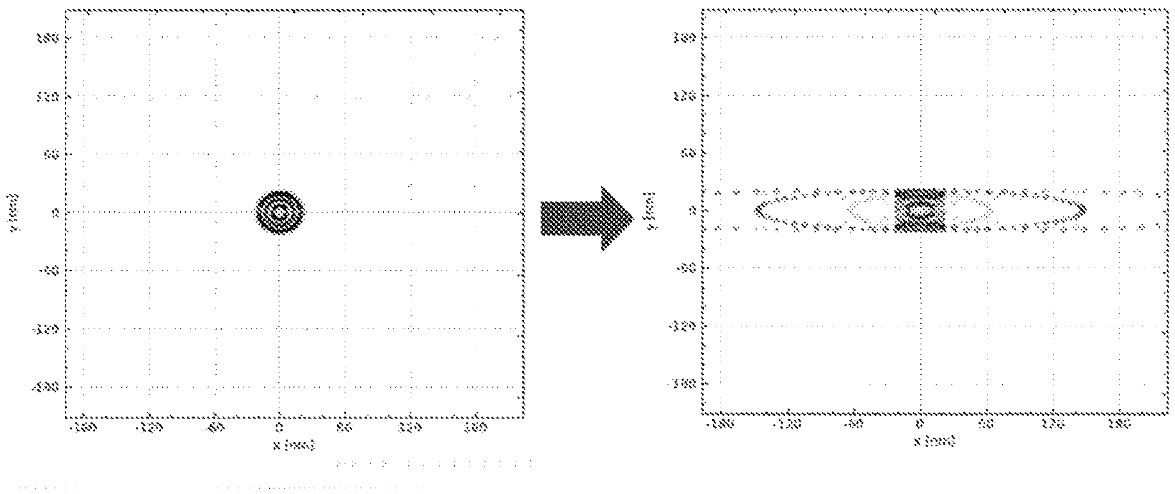
FIG. 6 shows how the aberration compensation provided by the octupole field limits the aberration of the spot width when ion beam current is increased.

We now describe further the plots of FIGS. 4 and 6 in combination with control voltages used in an example embodiment. We have discussed in relation to FIG. 1 some of the voltages required for the ion beam focusing system. FIG. 5 shows that the octupole element 220 required for the present invention requires voltages having polarity that alternates from one electrode to the next. Typically, the magnitude of the voltage required here will be 10 V. The actual voltages applied to the electrodes of the octupole will be determined by an optimisation step during set-up. For example, a test piece may be imaged as the octupole element voltages are varied until the minimum aberration, and sharpest cut edge, is present in etching the test piece. If the octupole element provides a further beam conditioning functionality, such as a dipole to deflect the beam, then additional voltages may be applied to selected electrodes of the octupole element to superimpose the dipole field on to the octupole field.

In one embodiment the non-circular beam limiting aperture 215 may be a rectangular slot having dimensions of 40 μm×80 μm. The 40 μm sets the beam width in the primary scan direction and the 80 μm sets the length of the beam along the beam scan direction. These beam dimensions in combination with the power of the second lens 235 determine the spot size at the sample surface. For the slot dimensions provided here the spot size at the sample has a minimum dimension of 40 nm. FIG. 6 shows in the left hand figure a conventional circular beam. The size of the spot in the left hand of FIG. 6 is the same as that of FIG. 4. The right hand figure of FIG. 6 is similar to the right hand figure of FIG. 4 in that here the beam current has been increased by a factor 2 but in FIG. 6 the beam has passed through a rectangular aperture and aberration compensation applied. As can be seen in FIG. 6 the aberration compensation provided by the octupole field prevents the spot from spreading out in the direction perpendicular to the scan direction. In other words, the aberration compensation keeps the spot width to the desired nm even with increased current. The spot width in the scan direction does have some increased width but this is less important because it is in the path of the scanned beam. Material on which these aberrated parts of the ion beam are incident will likely be removed as the beam scans along. This technique allows a sharp edge to be maintained to the etched or milled material while also increasing throughput.

The present invention comfortably achieves a doubling in beam current. The beam current that can be provided for this arrangement is of the order of nA. The increase in beam current over conventional cutting and milling techniques is 2-3 times which will provide a 2-3 times increase in milling throughput. In other words 2-3 times the amount of material may be removed in a given time interval as compared to a conventional arrangement.

The aberration compensation according to the present invention allows a slot aperture to be used with increasing current applied in the slot elongate direction without adversely affecting the beam quality. Accordingly, increased milling throughput can be achieved because a higher beam current can be used without increasing the spot size in the cutting direction.

Figure 7:
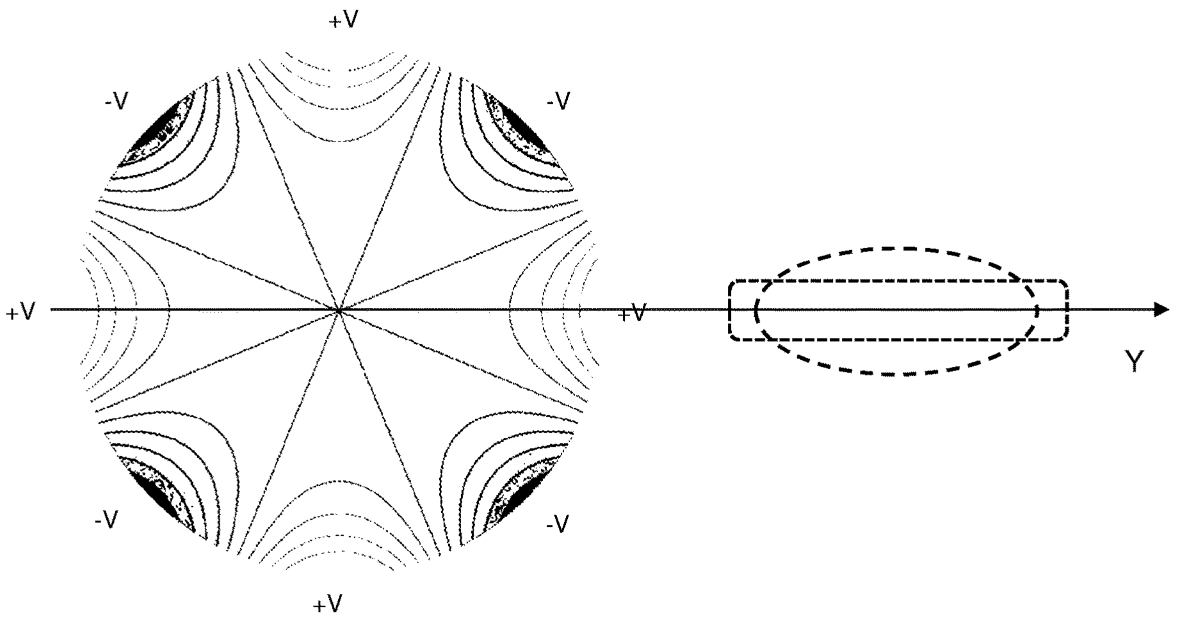
FIG. 7 is a diagram of an octupole field showing its orientation relative to aperture directions.

FIGS. 7 to 9 are provided as visualizations of an octupole field in comparison to other fields and to show the effect on an elongate beam shape.

The left hand figure of FIG. 7 is a diagram of an octupole field produced by an octupole element. Similar octupole fields may be produced by a higher multiplicity element such as a 12-pole element. As described above, the eight electrodes of the octupole element have static voltages applied to them but the polarity of the voltages alternates positive to negative from one electrode to the next as you move around the octupole element. The magnitude of the voltage on each electrode may be substantially the same. Also shown in FIG. 7 are two example elongate apertures, namely a substantially rectangular aperture and an elliptical aperture. As shown for the substantially rectangular aperture the corners of the apertures may be rounded. The elongate axis, or centreline, of each of the apertures is aligned with the Y-direction, which is the scan direction of the beam, as shown in FIGS. 2A and 2B. For the elliptical aperture this corresponds to the major axis of the ellipse. For the rectangular aperture, the Y-direction is parallel to, and spaced equally between the long sides of the rectangle. The octupole element is energized or biased so that opposing electrodes aligned to the Y-direction have positive polarity. For the octupole element each electrode has an extent making an angle of up to 45° to the azimuthal axis or beam axis. The positive electrodes end and the negative electrodes start at 22.5° to the Y-direction. FIG. 7 also shows the field lines of the octupole field. The field decreases moving away from the electrodes. The four dark areas at the diagonals of the octupole field represent areas of maximum negative field. Top, bottom, left and right extremes are areas of maximum positive field. We have assumed that the ions of the ion beam are metal ions and so have positive charge. The positive field is aligned with the Y-direction. If the ions are negative, then the electrodes aligned with the Y-direction should be negative.

Figure 8A:
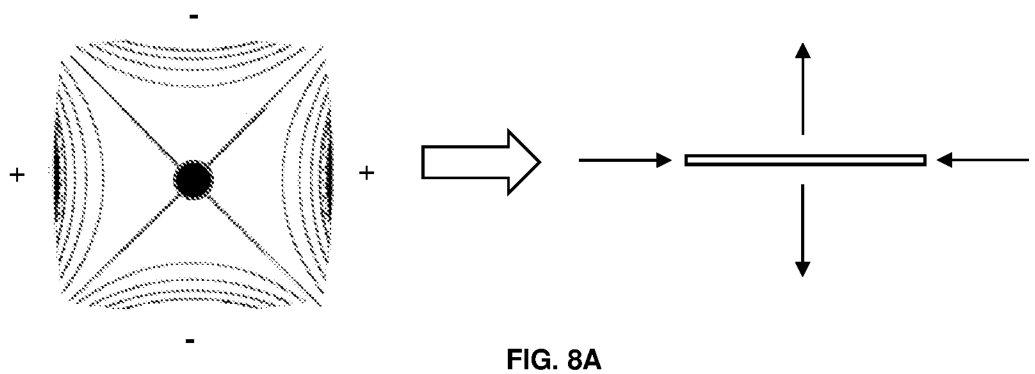
FIGS. 8A, 8B and 8C are respectively diagrams of a quadrupole field and its effect on a circular beam, an octupole field produced by an octupole element and its four-fold astigmatism effect, and an octupole field produced by a 16-pole element.
Figure 8B:
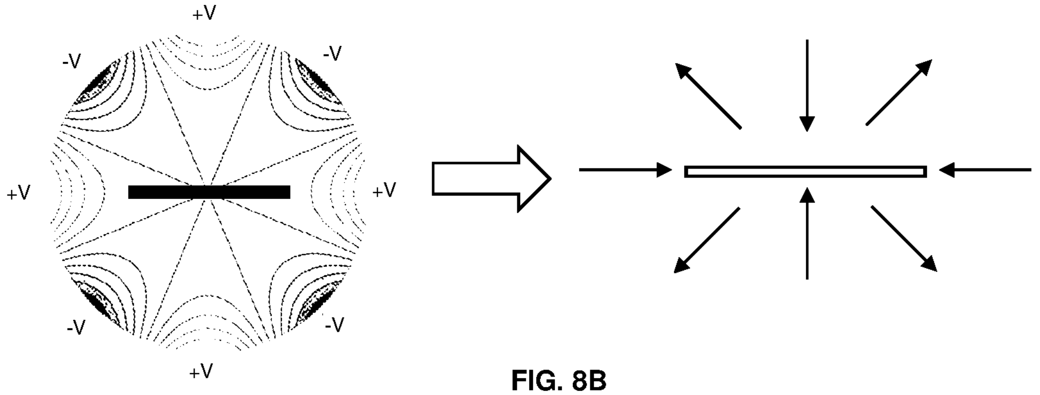

FIGS. 8A and 8B provide a comparison of a quadrupole element producing a quadrupole field with that of the octupole element producing the octupole field. As described earlier the octupole field produces four-fold astigmatism. This is represented in FIG. 8B by the arrows showing the effect of the astigmatism relative to a rectangular aperture. FIG. 8A shows the two-fold astigmatism produced by a quadrupole element for comparison. In FIG. 8A the two-fold astigmatism converts a beam with a circular cross-section to a rectangular beam.

Figure 8C:
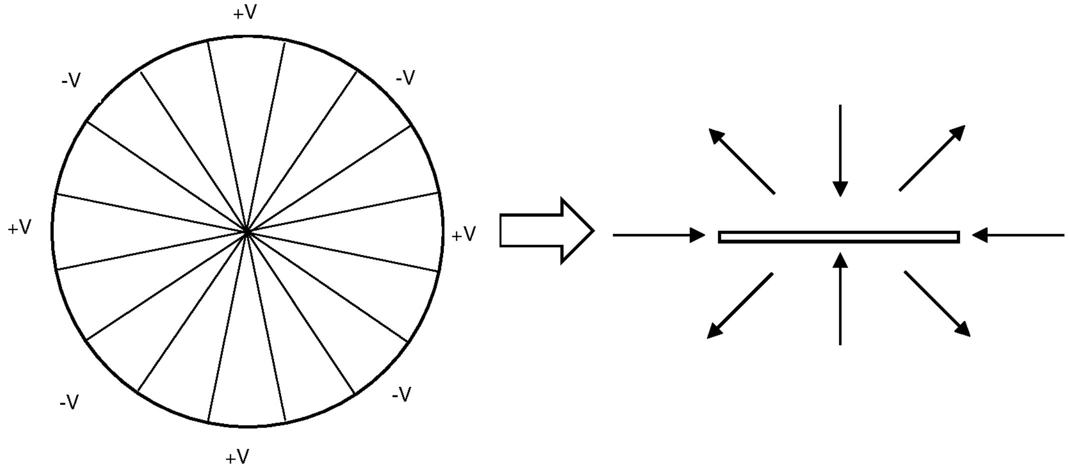

FIG. 8C shows how a 16-pole element produces an octupole field. Here, instead of alternating polarity from one electrode pole to the next, each is separated by an electrode that is at zero volts. Hence, the pattern of voltages around the poles may be +V, 0, −V, 0, +V, 0, −V, 0, +V, 0, −V, 0, +V, 0, −V and 0. Again as for the octupole element the poles aligned along the longitudinal axis of the aperture will be +V for positive ions.

In a similar manner other multipoles may be used. For example, for a 12-pole element, or other multi-pole element, the poles may be energized with voltages that provide the same polarity for the poles that align with opposing ends of the aperture while other poles provide alternating polarity. Multipoles having other numbers of poles may also be used and a distribution of voltages around the poles of the element may be used. For multipoles having greater than eight poles the rotational positioning of the field can be adjusted by rotating the position of the maximum positive and negative voltages on the poles/electrodes. In other embodiments the multipole element may be made up of stacked electrodes such that a first plane of electrodes is stacked on top of a second plane of electrodes along the azimuthal direction. For example, two octupole elements or sub-elements may be stacked with a 22.5° angular offset to form a 16-pole element. This can also provide a relative rotational positioning of the maximum and minimum voltages.

In each of these cases the astigmatism produced by the octupole field provides a force reducing the extent of the beam (squashing) in the directions parallel to the short and long sides of the rectangular aperture and provides a stretching force in the diagonal directions. The effect of spherical aberration left uncompensated would result in one or more lenses of the ion beam focusing column over-focusing the extremes of the beam causing a blurring at the target plane. The aberration compensation provided here acts in the opposite direction stretching the extremes of the beam such as at the diagonals to compensate for the over-focusing.

Figure 9A:
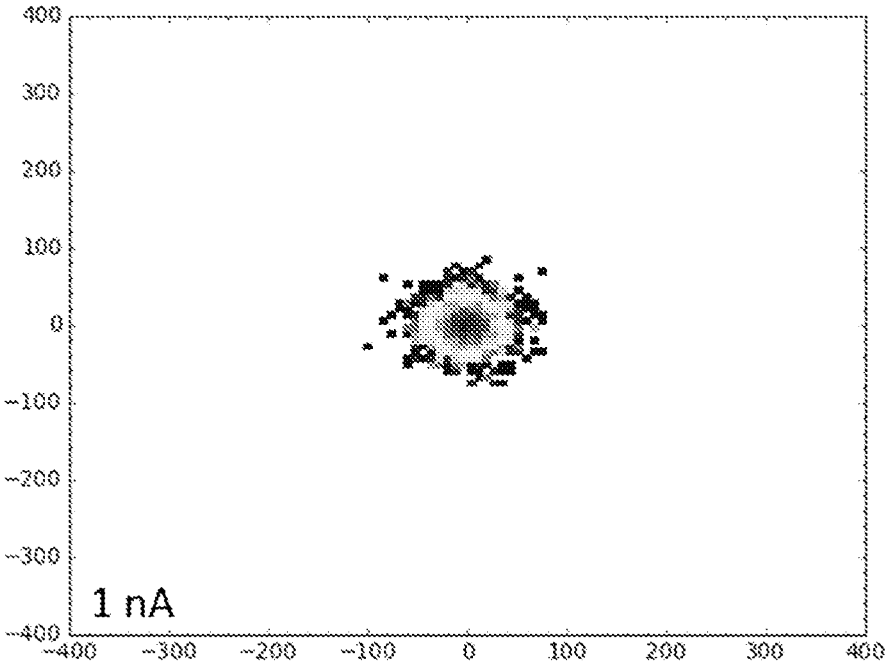
FIGS. 9A-9C are spot density diagrams respectively for a conventional beam passed through a circular aperture, a beam passed through a rectangular aperture, and a beam passed through a rectangular aperture with aberration compensation provided by an octupole field.
Figure 9B:
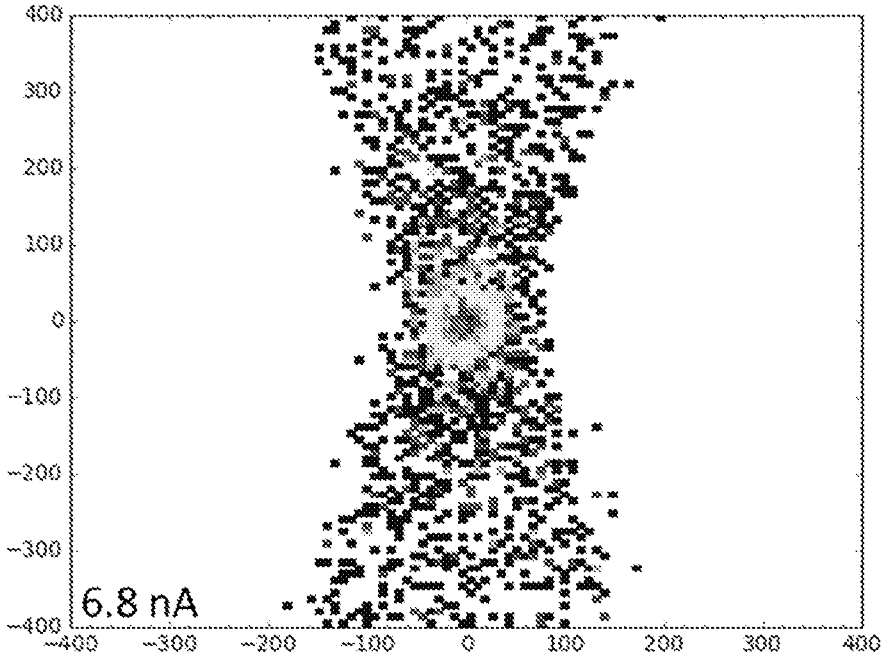
Figure 9C:
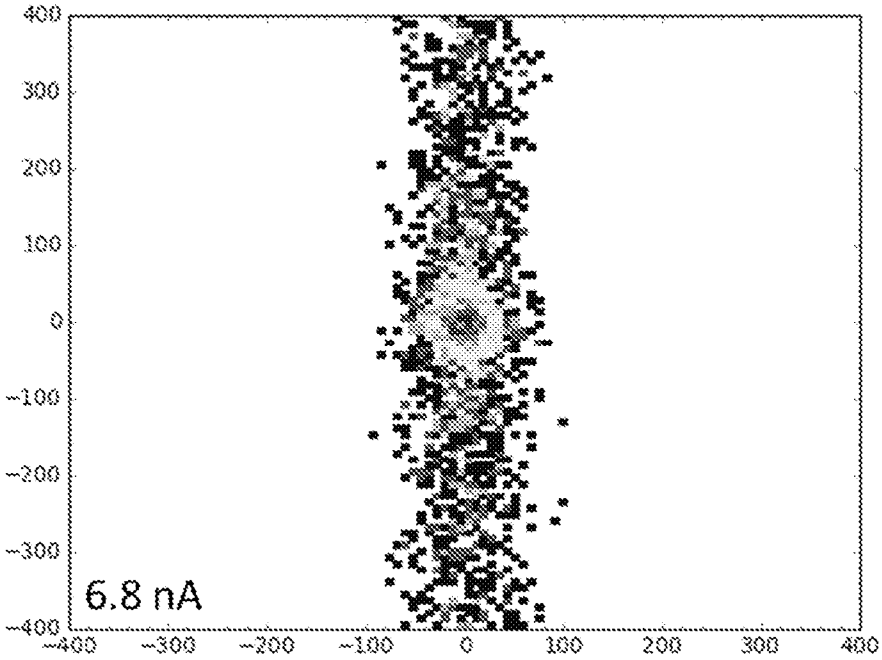

FIGS. 9A to 9C are spot density diagrams. FIG. 9A is a spot density diagram for a conventional 1 nA beam that has passed through a circular aperture. The spot shows the highest current density in the center of the beam and may have a Gaussian current density distribution. FIG. 9B is a spot density diagram for a beam that has passed through a rectangular aperture with a length that is increased by five times over the aperture for FIG. 9A. The current is also increased to 5.6 nA. As can be seen in the focused spot there is significant beam spreading in the horizontal direction. Hence, when used for milling in the vertical direction it would not provide a sharp cutting edge. FIG. 9C shows the effect of adding the octupole field compared to the spot density diagram of FIG. 9B. Here the same aperture and current is used but the octupole field compensates for the spherical aberration to provide a sharp edge to the spot or beam for precise milling.

Although FIGS. 9B-9C relate to a rectangular aperture, the spot density diagrams for a beam that has passed through an elliptical aperture are similar.

Figure 10:
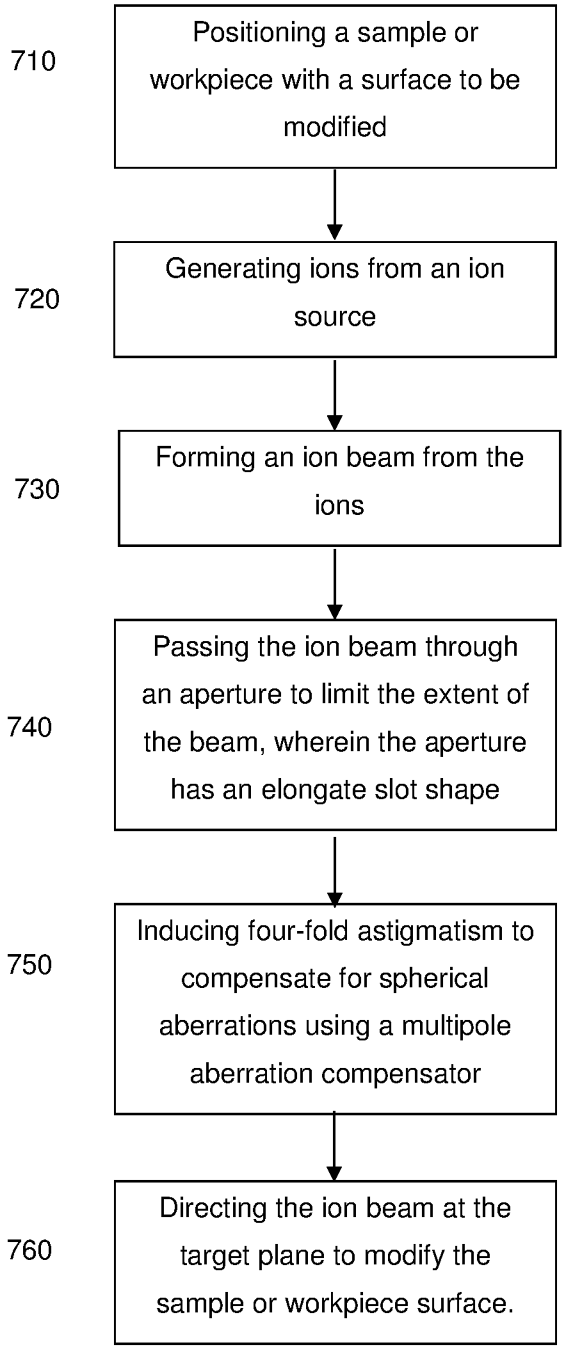
FIG. 10 is flow diagram of steps of a method of modifying a sample using an ion beam according to the present invention.

FIG. 10 is a flow diagram of a method according to the present invention for modifying a sample or workpiece using an ion beam. The modifying may comprise milling or etching the sample or workpiece. The method comprises at step 710 positioning a sample or workpiece with a surface to be modified at a target area. The positioning may include placing the sample of workpiece on a movable stage 112 and adjusting the position of the movable stage such that a region of the sample or workpiece to be modified is at a target area where the ion beam will be incident. The method further comprises generating at step 720 ions from an ion source such as from ion source 102 or 205. At step 730 an ion beam is formed using an ion beam focusing lens to at least partly converge or focus the ions diverging from the source. At step 740 at least part of the ion beam is passed through an aperture to limit the extent of the beam, wherein the aperture has a non-circular shape, such as an elongate slot shape. At step 750 the ion beam passes through a multipole aberration compensator, such as an octupole element, to induce four-fold astigmatism aberration to compensate for spherical aberration to the ion beam. At step 760 the ion beam is directed at the target plane to modify the sample or workpiece surface. The directing may be by a deflector system or deflector plates which scan the ion beam across the surface.

The person skilled in the art will readily appreciate that various modifications and alterations may be made to the above described ion beam system. The modifications may be made without departing from the scope of the appended claims. For example, the positioning of the octupole element and non-circular beam limiting aperture may be changed. Size and exact shape of the beam limiting aperture may also be changed.

The invention claimed is:

1. An ion beam system for modifying a sample or workpiece surface, the system comprising:
- an ion source for generating ions;
- an ion beam focusing column configured to direct ions received from the source to form an ion beam and focus the ion beam towards a target area; and
- a sample stage for receiving the sample or workpiece to be modified and for positioning the sample or workpiece surface at the target area,
- wherein the ion beam focusing column comprises:
  - an aperture plate having an elongate non-circular beam limiting aperture configured to limit the extent of the ion beam passing therethrough; and
  - a multipole aberration compensator configured to apply a four-fold astigmatism to the ion beam to compensate for spherical aberration produced by one or more lenses in the ion beam focusing column;
- wherein the ion beam system further comprises:
  - a beam deflector system configured to deflect the ion beam and move the ion beam in a first scan direction across the target area, and the elongate non-circular beam limiting aperture is arranged with its major dimension aligned such that the ion beam major dimension at the target area is parallel to the first scan direction, and the beam deflector system is further configured to move the ion beam across the target area, for modifying the sample or workpiece surface, with a leading edge having a width corresponding to the minor dimension; and
- wherein the four-fold astigmatism is aligned with the major dimension of the elongate non-circular beam limiting aperture to compensate for third order spherical aberration of the focused ion beam in the minor dimension at the sample or workpiece surface.

2. The ion beam system of claim 1, wherein the multipole aberration compensator is a multipole element configured to generate an octupole field.

3. The ion beam system of claim 2, wherein the multipole element is an octupole element.

4. The ion beam system of claim 2, wherein the multipole element is a multipole element having more than eight poles.

5. The ion beam system of claim 2, wherein the multipole element has 8, 12, or 16 poles.

6. The ion beam system of claim 2, wherein the multipole element comprises a plurality of multipole elements configured to generate an octupole field.

7. The ion beam system of claim 1, wherein the multipole aberration compensator is located at a position along the ion beam path before a final focusing lens.

8. The ion beam system of claim 1, wherein the multipole aberration compensator comprises eight or more poles and a pair of the poles arranged in opposition along the major dimension are configured to be biased with a same polarity.

9. The ion beam system of claim 1, wherein the elongate non-circular beam limiting aperture is an elliptical aperture, an oval aperture or a substantially rectangular aperture.

10. The ion beam system of claim 9, wherein:
- the elongate non-circular beam limiting aperture is a substantially rectangular aperture and the multipole aberration compensator comprises a pair of poles of the same polarity arranged in opposition along a direction parallel to the major dimension of the rectangular aperture; or
- the elongate non-circular beam limiting aperture is an elliptical or oval aperture and the multipole aberration compensator comprises a pair of poles of the same polarity arranged in opposition along a direction parallel to the major dimension of the elliptical or oval aperture.

11. The ion beam system of claim 1, wherein the deflector system is configured to raster scan the ion beam across the target area, and the major dimension of the ion beam at the target area is parallel to the scan line direction of the raster scan.

12. A method of modifying a sample or workpiece using an ion beam, the method comprising:
- positioning a sample or workpiece with a surface to be modified at a target area;
- generating ions from an ion source;
- forming an ion beam from the ions using a lens in an ion beam focusing column;
- limiting an extent of the ion beam by directing the beam through an elongate non-circular beam limiting aperture to produce an ion beam having a major dimension and a minor dimension;
- inducing, using a multi-pole aberration compensator, four-fold astigmatism to the aperture limited ion beam to compensate for spherical aberrations to the ion beam produced by one or more lenses in the ion beam focusing column, wherein the four-fold astigmatism is aligned with the major dimension of the elongate non-circular beam limiting aperture to compensate for third order spherical aberration of the focused ion beam in the minor dimension at the sample or workpiece surface;
- directing the ion beam at the target plane to modify the sample or workpiece surface; and moving the ion beam in a first scan direction across the target area for modifying the sample or workpiece surface, wherein the elongate non-circular aperture is arranged with its major dimension aligned such that the ion beam major dimension at the target area is parallel to the first scan direction, and wherein moving the ion beam across the target area for modifying the sample or workpiece surface comprises moving the ion beam with a leading edge having a width corresponding to the minor dimension.

13. The method of claim 12, wherein using the multi-pole aberration compensator to induce the four-fold astigmatism aberration comprises using a multipole element to generate an octupole field.

14. The method of claim 13, wherein the multipole element is an octupole element, a multipole element having more than eight poles such as 12-poles or 16-poles, or comprises a plurality of multipole elements configured to generate an octupole field.

15. The method of claim 12, further comprising moving the ion beam relative to the sample or workpiece surface to scan the ion beam across the surface, wherein the minor dimension is orthogonal to the scan direction of the ion beam.

16. The method of claim 12, wherein the non-circular beam limiting aperture is an elliptical aperture, an oval aperture or a substantially rectangular aperture.

* * * * *